United States Patent
Brittain et al.

(10) Patent No.: US 7,587,559 B2
(45) Date of Patent: Sep. 8, 2009

(54) SYSTEMS AND METHODS FOR MEMORY MODULE POWER MANAGEMENT

(75) Inventors: Mark A. Brittain, Pflugerville, TX (US); Warren E. Maule, Cedar Park, TX (US); Karthick Rajamani, Austin, TX (US); Eric E. Retter, Austin, TX (US); Robert B. Tremaine, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 434 days.

(21) Appl. No.: 11/463,743

(22) Filed: Aug. 10, 2006

(65) Prior Publication Data

US 2008/0040563 A1 Feb. 14, 2008

(51) Int. Cl.
G06F 12/00 (2006.01)

(52) U.S. Cl. .......................... 711/154; 711/5; 711/170

(58) Field of Classification Search .................. None
See application file for complete search history.

(56) References Cited

U.S. PATENT DOCUMENTS

| | | | |
|---|---|---|---|
| 2,842,682 A | 7/1958 | Clapper | |
| 3,333,253 A | 7/1967 | Sahulka | |
| 3,395,400 A | 7/1968 | De Witt | |
| 3,825,904 A | 7/1974 | Burk et al. ............... | 340/172.5 |
| 4,028,675 A | 6/1977 | Frankenberg ............... | 711/106 |
| 4,135,240 A | 1/1979 | Ritchie | |
| 4,150,428 A | 4/1979 | Inrig et al. | |
| 4,472,780 A | 9/1984 | Chenoweth et al. | |
| 4,475,194 A | 10/1984 | LaVallee et al. ............... | 371/10 |
| 4,486,739 A | 12/1984 | Franaszek et al. ........... | 340/347 |
| 4,641,263 A | 2/1987 | Perlman et al. | |
| 4,654,857 A | 3/1987 | Samson et al. | |
| 4,723,120 A | 2/1988 | Petty, Jr. ................ | 349/825.02 |
| 4,740,916 A | 4/1988 | Martin ....................... | 364/900 |
| 4,796,231 A | 1/1989 | Pinkham ................ | 365/189.05 |
| 4,803,485 A | 2/1989 | Rypinski .................... | 370/452 |
| 4,833,605 A | 5/1989 | Terada et al. ................. | 364/200 |
| 4,839,534 A | 6/1989 | Clasen ........................ | 307/269 |
| 4,943,984 A | 7/1990 | Pechanek et al. ............ | 375/109 |
| 4,985,828 A | 1/1991 | Shimizu et al. ............. | 364/200 |

(Continued)

FOREIGN PATENT DOCUMENTS

EP 0229316 A2 7/1987

(Continued)

OTHER PUBLICATIONS

International Search Report, International Patent Application No. PCT/US07/75944, mailed Sep. 23, 2008, 3 pages.

(Continued)

*Primary Examiner*—Jack A Lane
(74) *Attorney, Agent, or Firm*—Cantor Colburn LLP

(57) ABSTRACT

Systems and methods for determining memory module power requirements in a memory system. Embodiments include a memory system with a physical memory and a memory controller. The physical memory includes a plurality of memory devices. The memory controller is in communication with the physical memory and has a logical memory for storing power usage characteristics associated with the physical memory. The power usage characteristics are generated in response to a current operating environment of the memory system.

28 Claims, 7 Drawing Sheets

U.S. PATENT DOCUMENTS

| | | | |
|---|---|---|---|
| 5,053,947 A | 10/1991 | Heibel et al. | 364/200 |
| 5,177,375 A | 1/1993 | Ogawa et al. | |
| 5,206,946 A | 4/1993 | Brunk | 710/2 |
| 5,214,747 A | 5/1993 | Cok | 395/27 |
| 5,265,049 A | 11/1993 | Takasugi | |
| 5,265,212 A | 11/1993 | Bruce, II | 710/113 |
| 5,287,531 A | 2/1994 | Rogers, Jr. et al. | 395/800 |
| 5,347,270 A | 9/1994 | Matsuda et al. | 340/2.21 |
| 5,357,621 A | 10/1994 | Cox | |
| 5,375,127 A | 12/1994 | Leak | |
| 5,387,911 A | 2/1995 | Gleichert et al. | 341/95 |
| 5,394,535 A | 2/1995 | Ohuchi | 711/155 |
| 5,454,091 A | 9/1995 | Sites et al. | 395/413 |
| 5,475,690 A | 12/1995 | Burns et al. | 370/105.3 |
| 5,513,135 A | 4/1996 | Dell et al. | |
| 5,517,626 A | 5/1996 | Archer et al. | |
| 5,522,064 A | 5/1996 | Aldereguia et al. | |
| 5,544,309 A | 8/1996 | Chang et al. | |
| 5,546,023 A | 8/1996 | Borkar et al. | |
| 5,561,826 A | 10/1996 | Davies et al. | |
| 5,592,632 A | 1/1997 | Leung et al. | 395/306 |
| 5,594,925 A | 1/1997 | Harder et al. | |
| 5,611,055 A | 3/1997 | Krishan et al. | 395/281 |
| 5,613,077 A | 3/1997 | Leung et al. | 395/306 |
| 5,627,963 A | 5/1997 | Gabillard et al. | 714/42 |
| 5,629,685 A | 5/1997 | Allen et al. | 340/825.02 |
| 5,661,677 A | 8/1997 | Rondeau, II et al. | 365/63 |
| 5,666,480 A | 9/1997 | Leung et al. | 395/180 |
| 5,684,418 A | 11/1997 | Yanagiuchi | |
| 5,706,346 A | 1/1998 | Katta et al. | |
| 5,754,804 A | 5/1998 | Cheselka et al. | |
| 5,764,155 A | 6/1998 | Kertesz et al. | |
| 5,822,749 A | 10/1998 | Agarwal | 707/2 |
| 5,852,617 A | 12/1998 | Mote, Jr. | 714/726 |
| 5,870,325 A | 2/1999 | Nielsen et al. | 365/63 |
| 5,872,996 A | 2/1999 | Barth et al. | 395/853 |
| 5,917,760 A | 6/1999 | Millar | |
| 5,926,838 A | 7/1999 | Jeddeloh | 711/167 |
| 5,928,343 A | 7/1999 | Farmwald et al. | 710/104 |
| 5,930,273 A | 7/1999 | Mukojima | 714/776 |
| 5,959,914 A | 9/1999 | Gates et al. | |
| 5,973,951 A | 10/1999 | Bechtolsheim et al. | 365/52 |
| 5,974,493 A | 10/1999 | Okumura et al. | 710/307 |
| 5,995,405 A | 11/1999 | Trick | 365/63 |
| 6,003,121 A | 12/1999 | Wirt | |
| 6,011,732 A | 1/2000 | Harrison et al. | |
| 6,038,132 A | 3/2000 | Tokunaga et al. | 361/760 |
| 6,049,476 A | 4/2000 | Laudon et al. | 365/52 |
| 6,076,158 A | 6/2000 | Sites et al. | 712/230 |
| 6,078,515 A | 6/2000 | Nielsen et al. | 365/63 |
| 6,081,868 A | 6/2000 | Brooks | |
| 6,085,276 A | 7/2000 | VanDoren et al. | |
| 6,096,091 A | 8/2000 | Hartmann | 716/17 |
| 6,128,746 A | 10/2000 | Clark et al. | 713/324 |
| 6,145,028 A | 11/2000 | Shank et al. | |
| 6,170,047 B1 | 1/2001 | Dye | 711/170 |
| 6,170,059 B1 | 1/2001 | Pruett et al. | 713/200 |
| 6,173,382 B1 | 1/2001 | Dell et al. | 711/170 |
| 6,185,718 B1 | 2/2001 | Dell et al. | |
| 6,198,304 B1 | 3/2001 | Sasaki | |
| 6,215,686 B1 | 4/2001 | Deneroff et al. | 365/52 |
| 6,219,288 B1 | 4/2001 | Braceras et al. | |
| 6,219,760 B1 | 4/2001 | McMinn | |
| 6,233,639 B1 | 5/2001 | Dell et al. | |
| 6,260,127 B1 | 7/2001 | Olarig et al. | 711/167 |
| 6,262,493 B1 | 7/2001 | Garnett | |
| 6,285,172 B1 | 9/2001 | Torbey | |
| 6,292,903 B1 | 9/2001 | Coteus et al. | 713/401 |
| 6,301,636 B1 | 10/2001 | Schultz et al. | 711/108 |
| 6,308,247 B1 | 10/2001 | Ackerman et al. | |
| 6,317,352 B1 | 11/2001 | Halbert et al. | 365/52 |
| 6,321,343 B1 | 11/2001 | Toda | 713/600 |
| 6,338,113 B1 | 1/2002 | Kubo et al. | 711/105 |
| 6,349,390 B1 | 2/2002 | Dell et al. | |
| 6,357,018 B1 | 3/2002 | Stuewe et al. | |
| 6,370,631 B1 | 4/2002 | Dye | 711/170 |
| 6,378,018 B1 | 4/2002 | Tsern et al. | 710/129 |
| 6,381,685 B2 | 4/2002 | Dell et al. | |
| 6,393,512 B1 | 5/2002 | Chen et al. | |
| 6,393,528 B1 | 5/2002 | Arimilli et al. | 711/137 |
| 6,408,398 B1 | 6/2002 | Frecker et al. | |
| 6,425,044 B1 | 7/2002 | Jeddeloh | |
| 6,446,174 B1 | 9/2002 | Dow | |
| 6,467,013 B1 | 10/2002 | Nizar | |
| 6,473,836 B1 | 10/2002 | Ikeda | 711/137 |
| 6,477,614 B1 | 11/2002 | Leddige et al. | |
| 6,483,755 B2 | 11/2002 | Leung et al. | 365/189.05 |
| 6,484,271 B1 | 11/2002 | Gray | |
| 6,487,102 B1 | 11/2002 | Halbert et al. | |
| 6,487,627 B1 | 11/2002 | Willke et al. | 710/306 |
| 6,493,250 B2 | 12/2002 | Halbert et al. | 365/63 |
| 6,496,540 B1 | 12/2002 | Widmer | 375/242 |
| 6,496,910 B1 | 12/2002 | Baentsch et al. | 711/165 |
| 6,499,070 B1 | 12/2002 | Whetsel | |
| 6,502,161 B1 | 12/2002 | Perego et al. | 711/5 |
| 6,507,888 B2 | 1/2003 | Wu et al. | 711/105 |
| 6,510,100 B2 | 1/2003 | Grundon et al. | 365/233 |
| 6,513,091 B1 | 1/2003 | Blackmon et al. | 710/316 |
| 6,530,007 B2 | 3/2003 | Olarig | |
| 6,532,525 B1 | 3/2003 | Aleksic et al. | 711/168 |
| 6,546,359 B1 | 4/2003 | Week | 702/186 |
| 6,549,971 B1 | 4/2003 | Cecchi et al. | 710/306 |
| 6,553,450 B1 | 4/2003 | Dodd et al. | 711/105 |
| 6,557,069 B1 | 4/2003 | Drehmel et al. | 710/307 |
| 6,564,329 B1 | 5/2003 | Cheung et al. | 713/322 |
| 6,584,576 B1 | 6/2003 | Co | |
| 6,587,912 B2 | 7/2003 | Leddige | |
| 6,590,827 B2 | 7/2003 | Chang et al. | |
| 6,594,713 B1 | 7/2003 | Fuoco et al. | |
| 6,594,748 B1 | 7/2003 | Lin | |
| 6,601,121 B2 | 7/2003 | Singh et al. | 710/112 |
| 6,601,149 B1 | 7/2003 | Brock et al. | |
| 6,604,180 B2 | 8/2003 | Jeddeloh | |
| 6,611,905 B1 | 8/2003 | Grundon et al. | 711/167 |
| 6,622,217 B2 | 9/2003 | Gharacorloo et al. | 711/141 |
| 6,622,227 B2 | 9/2003 | Zumkehr et al. | |
| 6,625,687 B1 | 9/2003 | Halber et al. | 711/105 |
| 6,625,702 B2 | 9/2003 | Rentscler et al. | 711/167 |
| 6,628,538 B2 | 9/2003 | Funaba et al. | 365/63 |
| 6,631,439 B2 | 10/2003 | Saulsbury et al. | |
| 6,636,957 B2 | 10/2003 | Stevens et al. | |
| 6,643,745 B1 | 11/2003 | Palanca et al. | |
| 6,671,376 B1 | 12/2003 | Koto et al. | 380/210 |
| 6,678,811 B2 | 1/2004 | Rentschler et al. | 711/167 |
| 6,681,292 B2 | 1/2004 | Creta et al. | |
| 6,684,320 B2 | 1/2004 | Mohamed et al. | |
| 6,697,919 B2 | 2/2004 | Gharachorloo et al. | 711/141 |
| 6,704,842 B1 | 3/2004 | Janakiraman et al. | |
| 6,721,185 B2 | 4/2004 | Dong et al. | |
| 6,721,944 B2 | 4/2004 | Chaudhry et al. | |
| 6,738,836 B1 | 5/2004 | Kessler et al. | |
| 6,741,096 B2 | 5/2004 | Moss | |
| 6,748,518 B1 | 6/2004 | Guthrie et al. | |
| 6,754,762 B1 | 6/2004 | Curley | |
| 6,766,389 B2 | 7/2004 | Hayter et al. | |
| 6,775,747 B2 | 8/2004 | Venkatraman | |
| 6,791,555 B1 | 9/2004 | Radke et al. | |
| 6,799,241 B2 | 9/2004 | Kahn et al. | |
| 6,839,393 B1 | 1/2005 | Sidiropoulos | 375/372 |
| 6,877,076 B1 | 4/2005 | Cho et al. | |
| 6,877,078 B2 | 4/2005 | Fujiwara et al. | |
| 6,882,082 B2 | 4/2005 | Greeff et al. | |
| 6,889,284 B1 | 5/2005 | Nizar et al. | |
| 6,898,726 B1 | 5/2005 | Lee | |

| Patent No. | Date | Inventor | Class |
|---|---|---|---|
| 6,910,146 B2 | 6/2005 | Dow | |
| 6,918,068 B2 | 7/2005 | Vail et al. | |
| 6,938,119 B2 | 8/2005 | Kohn et al. | |
| 6,944,084 B2 | 9/2005 | Wilcox | |
| 6,948,091 B2 | 9/2005 | Bartels et al. | |
| 6,949,950 B2 | 9/2005 | Takahashi et al. | |
| 6,965,952 B2 | 11/2005 | Echartea et al. | |
| 6,977,536 B2 | 12/2005 | Chin-Chieh et al. | 327/116 |
| 6,993,612 B2 | 1/2006 | Porterfield | |
| 6,996,639 B2 | 2/2006 | Narad | |
| 7,047,370 B1 | 5/2006 | Jeter, Jr. et al. | |
| 7,047,371 B2 | 5/2006 | Dortu | |
| 7,047,384 B2 | 5/2006 | Bodas et al. | |
| 7,076,700 B2 | 7/2006 | Rieger | |
| 7,103,792 B2 | 9/2006 | Moon | |
| 7,120,743 B2 | 10/2006 | Meyer et al. | |
| 7,133,790 B2 | 11/2006 | Liou | |
| 7,177,211 B2 | 2/2007 | Zimmerman | |
| 7,194,593 B2 | 3/2007 | Schnepper | |
| 7,197,594 B2 | 3/2007 | Raz et al. | |
| 7,203,318 B2 | 4/2007 | Collum et al. | |
| 7,206,887 B2 | 4/2007 | Jeddeloh | |
| 7,206,962 B2 | 4/2007 | Deegan | |
| 7,210,059 B2 | 4/2007 | Jeddeloh | |
| 7,216,196 B2 | 5/2007 | Jeddeloh | |
| 7,216,276 B1 | 5/2007 | Azimi et al. | |
| 7,222,213 B2 | 5/2007 | James | |
| 7,227,949 B2 | 6/2007 | Heegard et al. | |
| 7,240,145 B2 | 7/2007 | Holman | |
| 7,260,685 B2 | 8/2007 | Lee et al. | |
| 7,266,634 B2 | 9/2007 | Ware et al. | |
| 7,296,129 B2 | 11/2007 | Gower et al. | |
| 7,304,905 B2 * | 12/2007 | Hsu et al. | 365/212 |
| 7,313,583 B2 | 12/2007 | Porten et al. | |
| 7,321,979 B2 | 1/2008 | Lee | |
| 7,353,316 B2 | 4/2008 | Erdmann | |
| 7,363,419 B2 | 4/2008 | Cronin et al. | |
| 7,363,436 B1 | 4/2008 | Yeh et al. | |
| 7,370,134 B2 | 5/2008 | Jeddeloh | |
| 7,386,575 B2 | 6/2008 | Bashant et al. | |
| 7,418,526 B2 | 8/2008 | Jeddeloh | |
| 7,421,525 B2 | 9/2008 | Polzin et al. | |
| 7,433,258 B2 | 10/2008 | Rao et al. | |
| 2001/0000822 A1 | 5/2001 | Dell et al. | 711/170 |
| 2001/0003839 A1 | 6/2001 | Kondo | 711/144 |
| 2001/0029566 A1 | 10/2001 | Shin | |
| 2002/0019926 A1 | 2/2002 | Huppenthal et al. | 712/15 |
| 2002/0038405 A1 | 3/2002 | Leddige et al. | 711/115 |
| 2002/0059439 A1 | 5/2002 | Arroyo et al. | |
| 2002/0083255 A1 | 6/2002 | Greeff et al. | 710/305 |
| 2002/0103988 A1 | 8/2002 | Dornier | 712/38 |
| 2002/0112119 A1 | 8/2002 | Halbert et al. | 711/115 |
| 2002/0112194 A1 | 8/2002 | Uzelac | 713/500 |
| 2002/0124195 A1 | 9/2002 | Nizar | 713/320 |
| 2002/0124201 A1 | 9/2002 | Edwards et al. | |
| 2002/0147898 A1 | 10/2002 | Rentschler et al. | 711/170 |
| 2002/0174274 A1 | 11/2002 | Wu et al. | 710/100 |
| 2003/0009632 A1 | 1/2003 | Arimilli et al. | |
| 2003/0028701 A1 | 2/2003 | Rao et al. | |
| 2003/0033364 A1 | 2/2003 | Garnett et al. | 709/203 |
| 2003/0051055 A1 | 3/2003 | Parrella et al. | |
| 2003/0056183 A1 | 3/2003 | Kobayashi | |
| 2003/0084309 A1 | 5/2003 | Kohn | |
| 2003/0090879 A1 | 5/2003 | Doblar et al. | |
| 2003/0105938 A1 | 6/2003 | Cooksey et al. | |
| 2003/0118044 A1 | 6/2003 | Blanc et al. | |
| 2003/0126354 A1 | 7/2003 | Kahn et al. | |
| 2003/0223303 A1 | 12/2003 | Lamb et al. | 365/230.06 |
| 2003/0229770 A1 | 12/2003 | Jeddeloh | |
| 2003/0235222 A1 | 12/2003 | Bridges et al. | |
| 2003/0236959 A1 | 12/2003 | Johnson et al. | 711/167 |
| 2004/0006674 A1 | 1/2004 | Hargis et al. | 711/156 |
| 2004/0015650 A1 | 1/2004 | Zumkehr et al. | |
| 2004/0049723 A1 | 3/2004 | Obara | 714/729 |
| 2004/0078615 A1 | 4/2004 | Martin et al. | |
| 2004/0098546 A1 | 5/2004 | Bashant et al. | |
| 2004/0098549 A1 | 5/2004 | Dorst | |
| 2004/0117588 A1 | 6/2004 | Arimilli et al. | 711/203 |
| 2004/0123222 A1 | 6/2004 | Widmer | |
| 2004/0128474 A1 | 7/2004 | Vorbach | 712/10 |
| 2004/0148482 A1 | 7/2004 | Grundy et al. | |
| 2004/0160832 A1 | 8/2004 | Janzen et al. | |
| 2004/0163028 A1 | 8/2004 | Olarig | |
| 2004/0165609 A1 | 8/2004 | Herbst et al. | |
| 2004/0199363 A1 | 10/2004 | Bohizic et al. | |
| 2004/0205433 A1 | 10/2004 | Gower et al. | |
| 2004/0230718 A1 | 11/2004 | Polzin et al. | |
| 2004/0246767 A1 | 12/2004 | Vogt | 365/154 |
| 2004/0250153 A1 | 12/2004 | Vogt | 713/500 |
| 2004/0260909 A1 | 12/2004 | Lee et al. | |
| 2004/0260957 A1 | 12/2004 | Jeddeloh et al. | |
| 2005/0023560 A1 | 2/2005 | Ahn et al. | 257/200 |
| 2005/0027941 A1 | 2/2005 | Wang et al. | |
| 2005/0044305 A1 | 2/2005 | Jakobs et al. | |
| 2005/0050237 A1 | 3/2005 | Jeddeloh et al. | 710/10 |
| 2005/0050255 A1 | 3/2005 | Jeddeloh | 710/317 |
| 2005/0066136 A1 | 3/2005 | Schnepper | 711/154 |
| 2005/0071542 A1 | 3/2005 | Weber et al. | |
| 2005/0071707 A1 | 3/2005 | Hampel | |
| 2005/0078506 A1 | 4/2005 | Rao et al. | |
| 2005/0080581 A1 | 4/2005 | Zimmerman et al. | 702/117 |
| 2005/0081129 A1 | 4/2005 | Shah et al. | |
| 2005/0086424 A1 | 4/2005 | Oh et al. | |
| 2005/0086441 A1 | 4/2005 | Myer et al. | |
| 2005/0097249 A1 | 5/2005 | Oberlin et al. | |
| 2005/0105350 A1 | 5/2005 | Zimmerman et al. | |
| 2005/0120157 A1 | 6/2005 | Chen et al. | 710/313 |
| 2005/0125702 A1 | 6/2005 | Huang et al. | |
| 2005/0125703 A1 | 6/2005 | Lefurgy et al. | |
| 2005/0138246 A1 | 6/2005 | Chen et al. | |
| 2005/0138267 A1 | 6/2005 | Bains et al. | |
| 2005/0144399 A1 | 6/2005 | Hosomi | 711/145 |
| 2005/0149665 A1 | 7/2005 | Wolrich et al. | |
| 2005/0177677 A1 | 8/2005 | Jeddeloh | |
| 2005/0177690 A1 | 8/2005 | LaBerge | 711/154 |
| 2005/0204216 A1 | 9/2005 | Daily et al. | 714/724 |
| 2005/0216678 A1 | 9/2005 | Jeddeloh | |
| 2005/0220097 A1 | 10/2005 | Swami et al. | |
| 2005/0223196 A1 | 10/2005 | Knowles | |
| 2005/0229132 A1 | 10/2005 | Butt et al. | 716/10 |
| 2005/0248997 A1 | 11/2005 | Lee | |
| 2005/0257005 A1 | 11/2005 | Jeddeloh | |
| 2005/0259496 A1 | 11/2005 | Hsu et al. | 365/226 |
| 2005/0289292 A1 * | 12/2005 | Morrow et al. | 711/105 |
| 2005/0289377 A1 | 12/2005 | Luong | |
| 2006/0036826 A1 | 2/2006 | Dell et al. | |
| 2006/0036827 A1 | 2/2006 | Dell et al. | |
| 2006/0080584 A1 | 4/2006 | Hartnett et al. | |
| 2006/0085602 A1 | 4/2006 | Huggahalli et al. | |
| 2006/0095592 A1 | 5/2006 | Borkenhagen | |
| 2006/0095679 A1 | 5/2006 | Edirisooriya | |
| 2006/0112238 A1 | 5/2006 | Jamil et al. | |
| 2006/0161733 A1 | 7/2006 | Beckett et al. | |
| 2006/0162882 A1 | 7/2006 | Ohara et al. | |
| 2006/0168407 A1 | 7/2006 | Stern | |
| 2006/0179208 A1 | 8/2006 | Jeddeloh | |
| 2006/0190674 A1 | 8/2006 | Poechmueller | |
| 2006/0195631 A1 | 8/2006 | Rajamani | |
| 2006/0206742 A1 | 9/2006 | James | |
| 2006/0212666 A1 | 9/2006 | Jeddeloh | |
| 2006/0224764 A1 | 10/2006 | Shinohara et al. | |
| 2006/0277365 A1 | 12/2006 | Pong | |
| 2006/0288172 A1 | 12/2006 | Lee et al. | |
| 2007/0005922 A1 | 1/2007 | Swaminathan et al. | |
| 2007/0025304 A1 | 2/2007 | Leelahakriengkrai et al. | |
| 2007/0038907 A1 | 2/2007 | Jeddeloh et al. | |

| | | | |
|---|---|---|---|
| 2007/0067382 | A1 | 3/2007 | Sun |
| 2007/0083701 | A1* | 4/2007 | Kapil .......................... 711/106 |
| 2008/0043808 | A1* | 2/2008 | Hsu et al. .................... 374/141 |
| 2008/0162807 | A1 | 7/2008 | Rothman et al. |
| 2008/0222379 | A1 | 9/2008 | Jeddeloh |

FOREIGN PATENT DOCUMENTS

| | | | |
|---|---|---|---|
| EP | 0470734 | A1 | 2/1992 |
| EP | 0899743 | A2 | 6/1998 |
| EP | 1429340 | A2 | 6/2004 |
| GB | 2396711 | A | 6/2004 |
| JP | 59153353 | A | 9/1984 |
| JP | 0114140 | A | 6/1989 |
| JP | 0432614 | | 11/1992 |
| JP | 10011971 | | 1/1998 |
| JP | 20040139552 | A | 5/2004 |
| JP | 2008003711 | A | 1/2008 |
| WO | 9621188 | | 7/1996 |
| WO | 9812651 | | 3/1998 |
| WO | 0223353 | A2 | 3/2002 |
| WO | WO2005038660 | | 4/2005 |
| WO | 2007109888 | | 10/2007 |

OTHER PUBLICATIONS

European Search Report, European Patent Application No. 05106701.5, mailed Oct. 7, 2008, 5 pages.
European Search Report, European Patent Application No. 05109837.4, mailed Oct. 7, 2008, 5 pages.
PCT International Search Report PCT/EP2006/068984. Mailed Feb. 16, 2007.
PCT International Search Report PCT/EP2007/057916. Mailed Dec. 14, 2007.
Wikipedia, Serial Communications, [online], [retrieved Apr. 10, 2007 from the Internet], http://en.wikipedia.org/wiki/Serial_communications, 3 pages.
International Search Report, International Application No. PCT/EP2007/054929, International Publication No. WO 2007/135144 A1, received Mar. 21, 2008.
PCT Search Report. PCT/EP2007/057915. Mailed Nov. 7, 2007.
Joe Jeddeloh, Fully Buffered DIMM (FB-DIMM), XP002490174, Advanced Systems Technology, Micron Technology, Inc. Apr. 16, 2008, 32 pages.
Timothy J. Dell, "The RAS Implications of DIMM Connector Failure Rates in Large, Highly Available Server Systems", The 53rd IEEE Holm Conference on Electrical Contacts, IEEE, Sep. 16-19, 2007, pp. 256-261.
"Using Dual and Mappable Spare Bus", XP000433763, IBM Technical Disclosure Bulletin, vol. 37, No. 2B, IBM Copr., NY, US, Feb. 1, 1994, pp. 59-63.
"Novel Bus Reconfiguration Scheme With Spare Lines", XP000676205, IBM Technical Disclosure Bulletin, vol. 29, No. 12, IBM Copr., NY, US, May 12, 1987, pp. 5590-5593.
European Search Report, European Patent Application 05106700.7, received Aug. 11, 2008.
Pedram, Massoud, "Tutorial and Survey Paper—Power Minimization in IC Design: Principles and Applications", ACM Transactions on Design Automation of Electronic Systems, vol. 1, No. 1, Jan. 1996, pp. 3-56.
Panda, P. R., et al., "Data and Memory Optimization Techniques for Embedded Systems", ACM Transactions on Design Automation of Electronic Systems, vol. 6, No. 2, Apr. 2001, pp. 149-206.

Benini, Luca, et al, "System-Level Power Optimization: Techniques and Tools", ACM Transactions on Design Automation of Electronic Systems, vol. 5, No. 2, Apr. 2000, pp. 115-192.
Boudon, et al., "Novel Bus Reconfiguration Scheme With Spare Lines", IBM Technical Disclosure Bulletin, May 1987, vol. 29, No. 12, pp. 1-3.
Brown, et al "Compiler-Based I/O Prefetching for Out-of-Core Applications", ACM Transactions on Computer Systems, vol. 19, No. 2, May 2001, pp. 111-170.
Ghoneima et al.; "Optimum Positioning of Interleaved Repeaters in Bidirectional Buses;" IEEE Transactions on Computer-Aided Design of Integrated Circuits and Systems, vol. 25, No. 3, Mar. 2005, pp. 461-469.
JEDEC Solid State Technology Association, "JEDEC Standard: DDR2 SDRAM Specification", Jan. 2004, JEDEC, Revision JESD79-2A, p. 10.
Jungjoon Kim et al.; "Performance and Architecture Features of Segmented Multiple Bus System;" IEEE Computer Society; 1999 International Conference on Parallel Processing (ICPP '99).
Natarajan, et al., "A Study of Performance Impact of Memory Controller Features in Multi-Processor Server Environment", pp. 80-87.
NB940259 (IBM Technical Disclosure Bulletin, Feb. 1994; vol. 37; pp. 59-64).
Nilsen, "High-Level Dynamic Memory Management for Object-Oriented Real-Time Systems", pp. 86-93.
Penrod, Lee, "Understanding System Memory and CPU Speeds: A laymans guide to the Front Side Bus (FSB)", Dec. 28, 2005, Direction . Org, pp. 1-5, http://www.directron.com/directron/fsbguide.html. [online]; [retrieved on Feb. 23, 2006]; retrieved from the Internet.
Seceleanu et al.; "Segment Arbiter as Action System;" IEEE 2003 pp. 249-252.
Singh, S., et al., "Bus Sparing for Fault-Tolerant System Design", IBM Technical Disclosure Bulletin, Dec. 1991, vol. 34, No. 71, pp. 117-118.
Sivencrona et al.; "RedCAN™: Simulations of two Fault Recovery Algorithms for CAN;" Proceedings for the 10th IEEE Pacific Rim International Symposium on Dependable Computing (PRDC'04); 2005.
U.S. Appl. No. 11/419,586, filed May 22, 2006. Robert Tremaine. "Systems and Methods for Providing Remote Pre-Fetch Buffers".
Wang, et al., "Guided Region Prefetching: A Cooperative Hardware/Software Approach", pp. 388-398.
IEEE, "IEEE Standard Test Access Port and Boundary-Scan Architecture", Jul. 23, 2001, IEEE Std 1149-1-2001, pp. 11-13.
Rosenberg, "Dictionary of Computers, Information Processing & Telecommuications", Second Edition, John Wiley & Sons, Inc. 1987. 3 pgs.
Yang, Q.; Bhuyan, L.N., "Analysis of packet-switched multiple-bus multiprocessor systems," Computers, IEEE Transactions on, vol. 40, No. 3, pp. 352-357, Mar. 1991.
Li, P; Martinez, J.; Tang, J.; Priore, S.,; Hubbard, K.; Jie Xue; Poh, E.; Ong MeiLin; Chok KengYin; Hallmark, C.; Mendez, D.; "Development and evaluation of a high performance fine pitch SODIMM socket package." Electronic Components and Technology Conference, 2004. Proceedings. 54th, vol. 1, pp. 1161-1166, Jun. 1-4, 2004.
Nilsen, "High-Level Dynamic Memory Management for Object-Oriented Real-Time Systems", Jan. 1, 1996, pp. 86-93.
Wang, et al., "Guided Region Prefetching: A Cooperative Hardware/Software Approach", Jun. 2003, pp. 388-398.
Natarajan, et al., "A Study of Performance Impact of Memory Controller Features in Multi-Processor Server Environment", WMPI, Jun. 2004, pp. 80-87.

* cited by examiner

SYSTEMS AND METHODS FOR MEMORY MODULE POWER MANAGEMENT

BACKGROUND OF THE INVENTION

This invention relates generally to computer memory, and more particularly to determining power consumption in memory systems at specific levels of use.

Contemporary high performance computing main memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges as related to overall system reliability due to customer expectations that new computer systems will markedly surpass existing systems in regard to mean-time-between-failure (MTBF), in addition to offering additional functions, increased performance, increased storage, lower operating costs, etc. Other frequent customer requirements further exacerbate the memory system design challenges, and include such items as ease of upgrade and reduced system environmental impact (such as space, power and cooling).

FIG. 1 relates to U.S. Pat. No. 5,513,135 to Dell et al., of common assignment herewith, and depicts an early synchronous memory module. The memory module depicted in FIG. 1 is a dual in-line memory module (DIMM). This module is composed of synchronous DRAMs 8, buffer devices 12, an optimized pinout, and an interconnect and capacitive decoupling method to facilitate high performance operation. The patent also describes the use of clock re-drive on the module, using such devices as phase-locked loops (PLLs).

FIG. 2 relates to U.S. Pat. No. 6,173,382 to Dell et al., of common assignment herewith, and depicts a computer system 10 which includes a synchronous memory module 20 that is directly (i.e. point-to-point) connected to a memory controller 14 via a bus 40, and which further includes logic circuitry 24 (such as an application specific integrated circuit, or "ASIC") that buffers, registers or otherwise acts on the address, data and control information that is received from the memory controller 14. The memory module 20 can be programmed to operate in a plurality of selectable or programmable modes by way of an independent bus, such as an inter-integrated circuit (I2C) control bus 34, either as part of the memory initialization process or during normal operation. When utilized in applications requiring more than a single memory module connected directly to a memory controller, the patent notes that the resulting stubs can be minimized through the use of field-effect transistor (FET) switches to electrically disconnect modules from the bus.

Relative to U.S. Pat. No. 5,513,135, U.S. Pat. No. 6,173,382 further demonstrates the capability of integrating all of the defined functions (address, command, data, presence detect, etc) into a single device. The integration of functions is a common industry practice that is enabled by technology improvements and, in this case, enables additional module density and/or functionality.

FIG. 3, from U.S. Pat. No. 6,510,100 to Grundon et al., of common assignment herewith, depicts a simplified diagram and description of a memory system 10 that includes up to four registered DIMMs 40 on a traditional multi-drop stub bus. The subsystem includes a memory controller 20, an external clock buffer 30, registered DIMMs 40, an address bus 50, a control bus 60 and a data bus 70 with terminators 95 on the address bus 50 and the data bus 70. Although only a single memory channel is shown in FIG. 3, systems produced with these modules often included more than one discrete memory channel from the memory controller, with each of the memory channels operated singly (when a single channel was populated with modules) or in parallel (when two or more channels where populated with modules) to achieve the desired system functionality and/or performance.

FIG. 4, from U.S. Pat. No. 6,587,912 to Bonella et al., depicts a synchronous memory module 210 and system structure in which the repeater hubs 320 include local re-drive of the address, command and data to the local memory devices 301 and 302 via buses 321 and 322; generation of a local clock (as described in other figures and the patent text); and the re-driving of the appropriate memory interface signals to the next module or component in the system via bus 300.

FIG. 5 depicts a contemporary memory system composed of an integrated processor chip 500, which contains one or more processor elements and an integrated memory controller 510. In the configuration depicted in FIG. 5, multiple independent cascade interconnected memory busses 506 are logically aggregated together to operate in unison to support a single independent access request at a higher bandwidth with data and error detection/correction information distributed or "striped" across the parallel busses and associated devices. The memory controller 510 attaches to four narrow/high speed point-to-point memory busses 506, with each bus 506 connecting one of the several unique memory controller interface channels to a cascade interconnected memory subsystem 503 (or memory module) which includes at least a hub device 504 and one or more memory devices 509. Some systems further enable operations when a subset of the memory busses 506 are populated with memory subsystems 503. In this case, the one or more populated memory busses 508 may operate in unison to support a single access request.

The memory controller 510 translates system requests for memory access into packets according to the hub network communication protocol. Memory write packets contain at least a command, address, and associated data; and memory read packets contain at least a command and address. Memory read packets imply that an expected packet will be replied containing the data.

In the memory system depicted in FIG. 5, a DC-DC power converter 516, or voltage regulator module supplies current at a regulated voltage to the memory devices 509 in the memory subsystems 503. Typically, and as shown in FIG. 5, a separate power converter 511 does the same for the integrated processor chip 500. Generally, DC-DC power converters are digitally controlled, and usually have the means to sense current and voltage, and include the means for communicating this operational information to the processor, service processor or other monitoring, control and/or error-reporting circuitry via a service interface (e.g., the service bus 512) or any other bus. In the configuration depicted in FIG. 5, the power converters (511, 516), along with various other devices in the system, are connected to a service bus 512. Either the integrated processor chip 500 directly communicates on the service bus 512, or it can do so indirectly through an IO channel 513 and IO bridge device 514 to provide program software access to the devices on the service bus. Via the IO bridge device 514, the integrated processor chip 500 can read information from any of the power converters (511, 516) and the memory subsystems 503. Although a single power converter 516 is shown, memory systems may include additional power converters 516 based on expected power consumption, cooling, main memory expandability, memory placement in the system, reliability, availability, serviceability (RAS), etc.

At system start-up, the main memory is empty and not configured, so the integrated processor chip 500 begins running a software program (typically Basic Input/Output System or BIOS) from a non-volatile memory 515 (typically a FLASH memory) via the IO bridge 514 and the IO channel 513. The BIOS software program prepares the main memory for operation, copying itself into the main memory and transferring program execution to the program in the main memory from the program execution in non-volatile memory 515. Preparing the main memory for operation generally includes the steps of: detecting installed memory attributes such as memory voltage, speed, refresh requirements, available functions, and number of ranks installed; setting memory operational characteristics such as register settings for timings and latencies; and completing a basic memory test to ensure functionality. The memory attributes and operational characteristics are stored in memory rank configuration registers 508 in the memory controller 510 and used by the memory controller 510 in operating the memory system.

FIG. 6 depicts a block diagram of a memory hub device 504 including a link interface 604 for providing the means to re-synchronize, translate and re-drive high speed memory access information to associated DRAM devices 509 and/or to re-drive the information downstream on memory bus 506 as applicable based on the memory system protocol. The information is received by the link interface 604 from an upstream memory hub device 504 or from a memory controller 510 (directly or via an upstream memory hub device 504) via the memory bus 506. The memory device data interface 615 manages the technology-specific data interface with the memory devices 509 and controls the bi-directional memory device data bus 608. The memory hub control 613 responds to access request packets by responsively driving the memory device 509 technology-specific address and control bus 614 (for memory devices in RANK0) or address and control bus 614' (for memory devices in RANK1) and directing the read data flow 607 and write data flow 610 selectors.

The link interface 604 in FIG. 6 decodes the packets and directs the address and command information directed to the local hub device 504 to the memory hub control 613. Memory write data from the link interface 604 can be temporarily stored in the write data queue 611 or directly driven to the memory devices 509 via the write data flow selector 610 and internal bus 612, and then sent via internal bus 609 and memory device data interface 615 to memory device data bus 608. Memory read data from memory device(s) 509 can be queued in the read data queue 606 or directly transferred to the link interface 604 via internal bus 605 and read data selector 607, to be transmitted on the upstream bus 506 as a read reply packet.

Memory power is dominate in many server computers and the capacity for power converters is designed to meet the majority of the computational environments, but generally cannot meet the maximum memory power in all configurations and utilizations. Further, memory module power utilization varies quite widely between different memory configurations (with different device densities, device I/O widths, number of ranks, number of devices activated, etc.), manufacturing sources and environmental conditions. Various techniques are used to manage memory utilization such as throttling memory activity in reaction to a power overload condition signal, or based on power specifications or historical empirical data for a given memory condition.

What is needed is a method for determining the actual power utilization for specific memory hardware at actual utilizations and environmental conditions. These measurements could then be used by a memory controller to proactively manage the power utilization in a memory system.

BRIEF SUMMARY OF THE INVENTION

Embodiments include a memory system with a physical memory and a memory controller. The physical memory includes a plurality of memory devices. The memory controller is in communication with the physical memory and has a logical memory for storing power usage characteristics associated with the physical memory. The power usage characteristics are generated in response to a current operating environment of the memory system.

Other embodiments include a memory system for storing and retrieving data for a processing system. The memory system includes a plurality of memory devices, a memory controller, a memory bus and a memory hub device. The memory controller receives and responds to memory access requests and includes a logical memory for storing power usage characteristics associated with one or more of the memory devices. The memory bus is in communication with the memory controller. The memory hub device is in communication with the memory bus and with the memory devices. The power usage characteristics are generated in response to a current operating environment of the memory system.

Further embodiments include a method for measuring power utilization in a memory system. The method includes initializing a physical memory to a minimum power operational state. Power supplied to the physical memory is measured to establish nominal power consumption. Memory requests are generated at a specific level of utilization targeting selected segments in the physical memory while simultaneously measuring the supplied power to the physical memory. This establishes power consumption for the memory access requests at the selected segments in the physical memory. The additional power consumption created by the memory access requests is computed by subtracting the nominal power consumption from the power consumption for the memory access request. The calculated additional power consumption is stored as a power usage characteristic associated with the specific level of utilization and the selected segments.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

Exemplary embodiments provide an apparatus and method for determining and correlating actual memory power consumption to specific utilization in a computer memory system. During system initialization (and optionally at specific time intervals, temperatures or in response to specific system conditions) memory sub-system power converter(s) and/or separate power monitor(s) associated with the memory subsystem are sampled (or measured) and logged while specific memory devices are being accessed at predetermined rates. In exemplary embodiments, these power usage characteristics are logged into power characterization register bits in the memory rank configuration registers 508 located in the memory controller 510. These register bits are configured with power characteristics as a function of utilization for the ranks of memory devices 509. In exemplary embodiments the memory controller 510 regulates the memory power and thermal load in the system by regulating the memory utilization according to the "power costs" for using the various ranks of memory devices 509 and associated hardware. The correlated results are used to compute operational parameters (e.g., Amps/read, Amps/write, thermal Watts/read, and thermal Watts/write) which are retained and used by the memory controller 510 to regulate system power and/or temperature during high utilization.

In exemplary embodiments, a "power measurement" software program is used to configure the power characterization register bits during system start-up. The power measurement software program is integrated into the BIOS, and is invoked from the program image in main memory after the memory configuration is complete and the BIOS image has been copied into the main memory during the system start-up process. In alternate exemplary embodiments, the power measurement software program is invoked as a separate program from BIOS. In general, it is not practical to run the power measurement software program as an application on the operating system (OS) software, as physical memory addresses are virtualized after the OS has been started, and specific physical memory ranks are not deterministically referenced.

Figure 7:
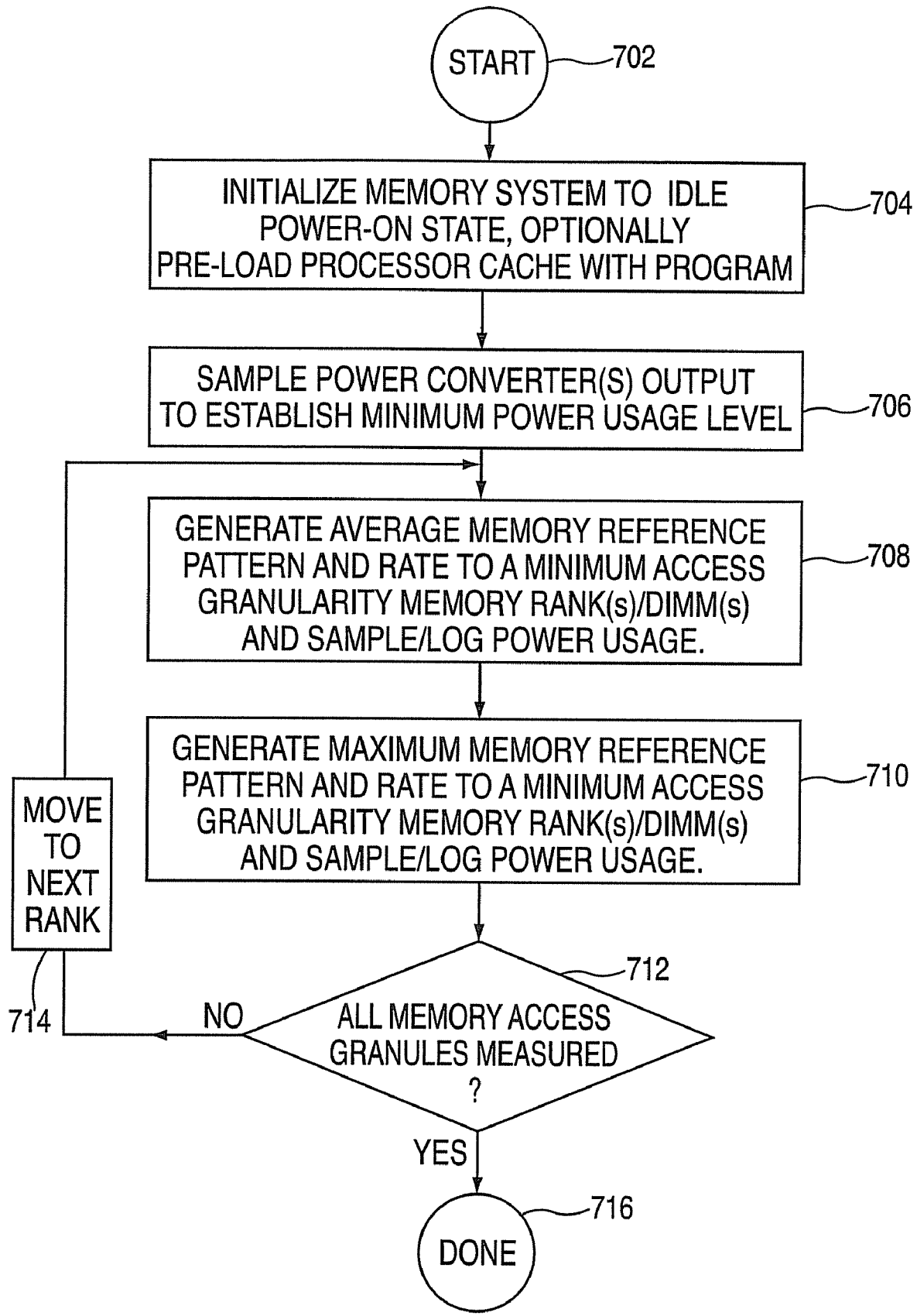
FIG. 7 is a process flow diagram that may be utilized to determine memory module power in exemplary embodiments.

FIG. 7 depicts a process that may be implemented by exemplary embodiments of the power management software program. In exemplary embodiments, the power management software program is executed as part of executing the system BIOS. Upon invocation at block 702, block 704 is performed and the memory is initialized to an idle power-on state (also referred to as a "minimum power operational state") where the memory devices 509 are in a low power operational state (typically IDD2 or similar precharge state for DDRII SDRAM) and the power management software program is executing from processor cache memory in the processor after the program has loaded it self into the cache. Having the power management software program execute from the processor cache precludes any influence on the main memory power usage due to the execution of the power management software.

At block 706, the memory power converter(s) are referenced via a service bus to determine the minimum memory system power. This step may be performed several times to average variability and disqualify any spurious measurements. The resultant value is used later in the process to normalize the activity measurements. Block 708 starts a loop (from block 708 to block 710 to block 712 to block 714 and back to block 708) that is performed for each rank of memory devices in the memory system. The processing in the loop measures power at predetermined activity levels for each rank of memory devices 509. Predetermined activity levels consist of sequences of read and/or write accesses at specific rates to memory devices 509 with specific data patterns. The activity is initiated by the power management software program by either directly accessing the memory (by-passing the caches), or indirectly by initiating read and write accesses to addresses strided to cause 'cache write-backs' and 'load cache lines' from memory. To have accurate measurements, the memory reference activity in blocks 708 and 710 should persist for longer than the capacitive power delivery time constant (typically several milliseconds) to ensure that the required memory power is being supplied from the memory power converter(s) 516).

At block 708, an average activity rate and pattern is targeted to the address range specific to the first rank of memory devices (first rank in the first time through the loop, subsequent ranks in subsequent executions of the loop), and the targeted memory power converter(s) 516 are then referenced via the service bus 512 to sample the memory system power. An average memory reference pattern and rate may be, for example, about thirty percent utilization. The power usage for the rank being tested is calculated and stored in the power characterization register bits. The power usage for the rank being tested represents the additional power consumption and is calculated by subtracting the minimum memory system power (also referred to as "nominal power consumption") from the sampled memory system power. Block 708 may be performed several times to average variability and disqualify any spurious measurements. In exemplary embodiments, when block 708 is performed more than once for a particular rank, the average of the power usage samples is used as the basis for the value stored in the power characterization register bits.

At block 710, a maximum activity rate and pattern is targeted to the address range specific to the first rank of memory devices (first rank in the first time through the loop, subsequent ranks in subsequent executions of the loop), and the memory power converter(s) 516 are then referenced via the service bus 512 to sample the memory system power. A maximum memory reference pattern and rate may be, for example, about sixty percent utilization. The power usage for the rank being tested is calculated and stored in the power characterization register bits. The power usage for the rank being tested represents the additional power consumption and is calculated by subtracting the minimum memory system power (also referred to as "nominal power consumption") from the sampled memory system power. Block 710 may be performed several times to average variability and disqualify any spurious measurements. In exemplary embodiments, when block 710 is performed more than once for a particular rank, the average of the power usage samples is used as the basis for the value stored in the power characterization register bits.

Although the sequence defined by blocks 706, 708 and 710 describe three power usage levels (described as nominal power consumption and the additional power consumption associated with average and maximum activity rates), power consumption can also be measured at one or more activity levels that more accurately correlate to known or expected memory activity rate and pattern (sequences). The thermal loading effects (e.g. memory system temperature increase or decrease resulting from a given power consumption within a known environment (e.g. airflow, inlet temperature, altitude, physical configuration)) can be calculated based on the measured temperature change for a memory activity rate and pattern (e.g. the power consumption associated with the memory activity rate and pattern). The thermal load(s) associated with the one or more measured memory sequence(s) can be logged in the form of a "conversion factor", e.g. in the form of degrees C per Watt, to enable accurate prediction of the temperature increase or decrease that will result from the execution of a memory sequence that closely correlates to the measured memory activity rate and pattern for that system environment.

Upon completing all measurements (e.g., blocks 708 and 710) with the currently targeted memory rank, block 712 is performed to determine if there are any more ranks to be tested. If there are more ranks to be tested, then block 714 is performed and the next rank is selected. Processing then continues at block 708.

If there are no more ranks to be tested, as determined at block 712, then the process is completed and the power management software program returns control back to the BIOS at block 716.

In exemplary embodiments, additional steps are included in the process depicted in FIG. 7 to measure memory power for other activity rates and with other patterns or under different environmental conditions (e.g., temperature, voltage). In exemplary embodiments, the sampled memory system power is not normalized by subtracting the nominal power consumption before being stored in the power characterization register bits (or any logical memory location in the memory controller 510, processor 500, service processor, I/O device or other storage medium) associated with the memory rank currently being tested. In addition, the power usage characteristics may be encoded for efficiency (e.g., in storage space).

In further exemplary embodiments the power usage characteristics relate to one or both of physical memory utilization rates and memory access reference patterns.

In further exemplary embodiments, the memory controller 510 utilizes one or more of the power usage characteristics to perform proactive power management in the memory system. For example, the memory controller 510 may insert a delay between accesses and/or reorder accesses to the ranks. As is known to those skilled in the art, a number of actions may be taken by the memory controller, processor or service processor to manage the power consumption levels. Generally, the memory controller 510 can proactively manage the power consumption levels by anticipating a particular power level based on actual or expected memory utilization at particular memory devices. The processor or service processor can further directly or indirectly modify (or regulate) the power consumption levels (and/or temperature) by one or more methods such as adjusting the system cooling (e.g. airflow, inlet air temperature, air baffles) or reducing other related power consumption (e.g. system workload, task scheduling). Exemplary embodiments enable one or more of the system elements (e.g. memory controller, processor, service processor) to proactively manage memory system power usage, based on actual power measurements as compared to reacting to real-time indications of excessive power or temperature.

Following is an exemplary embodiment that may be utilized by a memory controller to proactively perform power management by regulating a memory access request service rate. As described previously, power usage characteristics (e.g., power consumption, temperature) are generated by the power management software program described herein. The power usage characteristics are measured in, and therefore reflect, the current operating environment (e.g., elevation, ambient air temperature, memory system configuration) of the memory system. In exemplary embodiments, the memory system is at a customer location and is being utilized to perform business tasks, and thus the power usage characteristics reflect the specific, current operating environment at the customer location. The power usage characteristics are accessible by the controller along with a current measurement of power consumption and/or temperature for the memory system. Alternatively, the current measurement(s) may be estimated using the stored power usage characteristics.

When a new memory command is received by the memory controller, the memory controller uses the power usage characteristics to estimate the effects (e.g., on power consumption and temperature) that performing the new command will have on the memory system. The memory controller compares the predicted power consumption and/or temperature to a threshold value (e.g., a maximum temperature, a maximum power consumption) and regulates the physical memory access request service rate based on the results of the comparison. For example, the new command may be delayed if its execution would cause one or more of the power consumption and temperature to exceed the corresponding threshold values, or the new command may be executed if executing it would not cause the threshold value to be exceeded. In this manner, the memory controller regulates the memory access request service rate proactively to ensure that a defined threshold (i.e., threshold value) is not exceeded.

In still further exemplary embodiments, the power usage characteristics are updated while the memory system is operating based on the latest supplied power measurements. This provides a feedback loop for improving the power management in the memory system based on the latest data, which can reflect information such as power consumption based on the current memory temperature, memory subsystem changes (e.g. module replacement), etc.

In further exemplary embodiments, the physical memory is pre-conditioned with activity before the sampling in blocks 708 and 710 in FIG. 7 are executed. In this manner, the physical memory can be brought to a particular operating temperature before the sampling takes place, thereby enabling power measurements to be made at one or more targeted temperature ranges such that power consumption vs. temperature can be obtained to enable more accurate regulation of memory system power and/or temperatures.

In further exemplary embodiments, the power is measured with other current measurement devices independent of the power converter(s) 516. One such method would be the use of an analog-to-digital converter used to measure the voltage drop across a precision resistor. The measured voltage drop could be used, in conjunction with the known precision resistor value and the programmed or measured memory voltage value, to calculate the power consumption of the memory system.

Exemplary embodiments include a computing system with a processor(s) and an I/O unit(s) (e.g., requesters) interconnected to a memory system that contains a memory controller and memory devices. In exemplary embodiments, the memory system includes a processor or memory controller interfaced to a set of hub devices (also referred to as "hub chips"). The hub devices connect and interface to the memory devices. In exemplary embodiments the computer memory system includes a physical memory array with a plurality of memory devices for storing data and instructions. These memory devices may be connected directly to the memory controller and/or indirectly coupled to the memory controller through hub devices. In exemplary embodiments, the hub-based computer memory system has memory devices attached to a communication hub device that is connected to a memory control device (e.g., a memory controller). Also in exemplary embodiments, the hub device is located on a memory module (e.g, a single substrate or physical device) that includes two or more hub devices that are cascaded interconnected to each other (and possibly to another hub device located on another memory module) via the memory bus.

Hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

Figure 1:
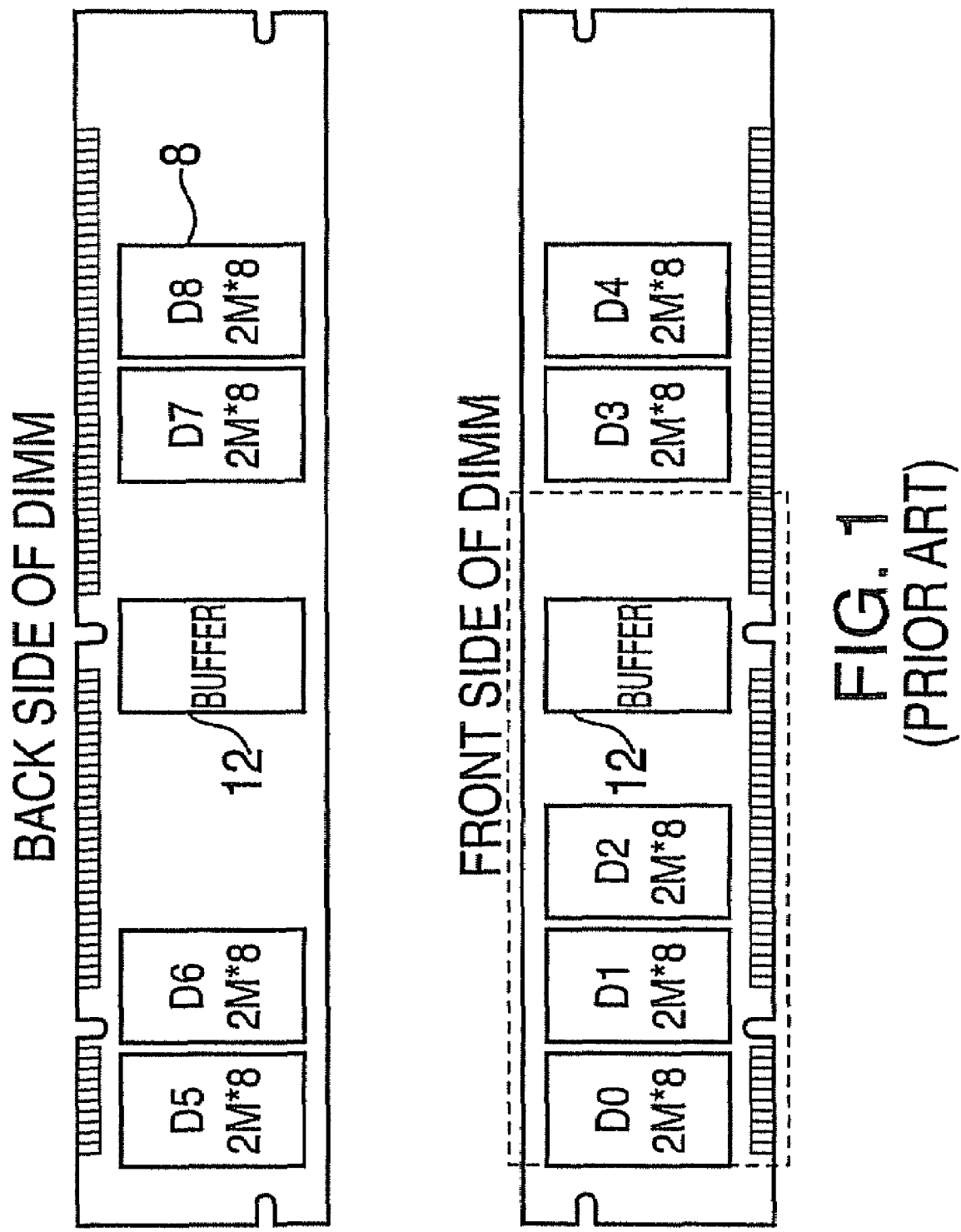
FIG. 1 depicts an exemplary early synchronous memory module.
Figure 2:
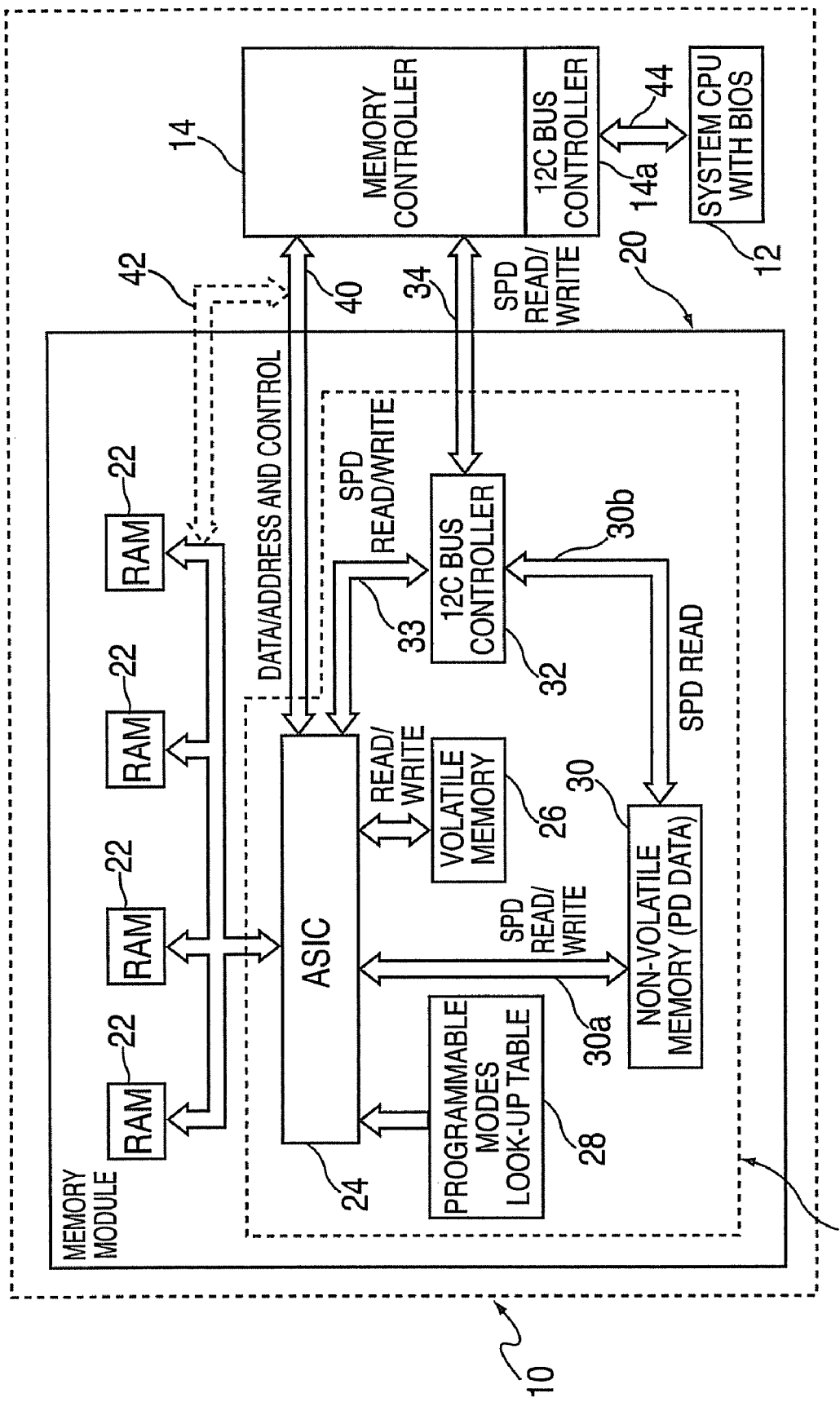
FIG. 2 depicts an exemplary computer system with a fully buffered synchronous memory module that is directly connected to a memory controller.
Figure 3:
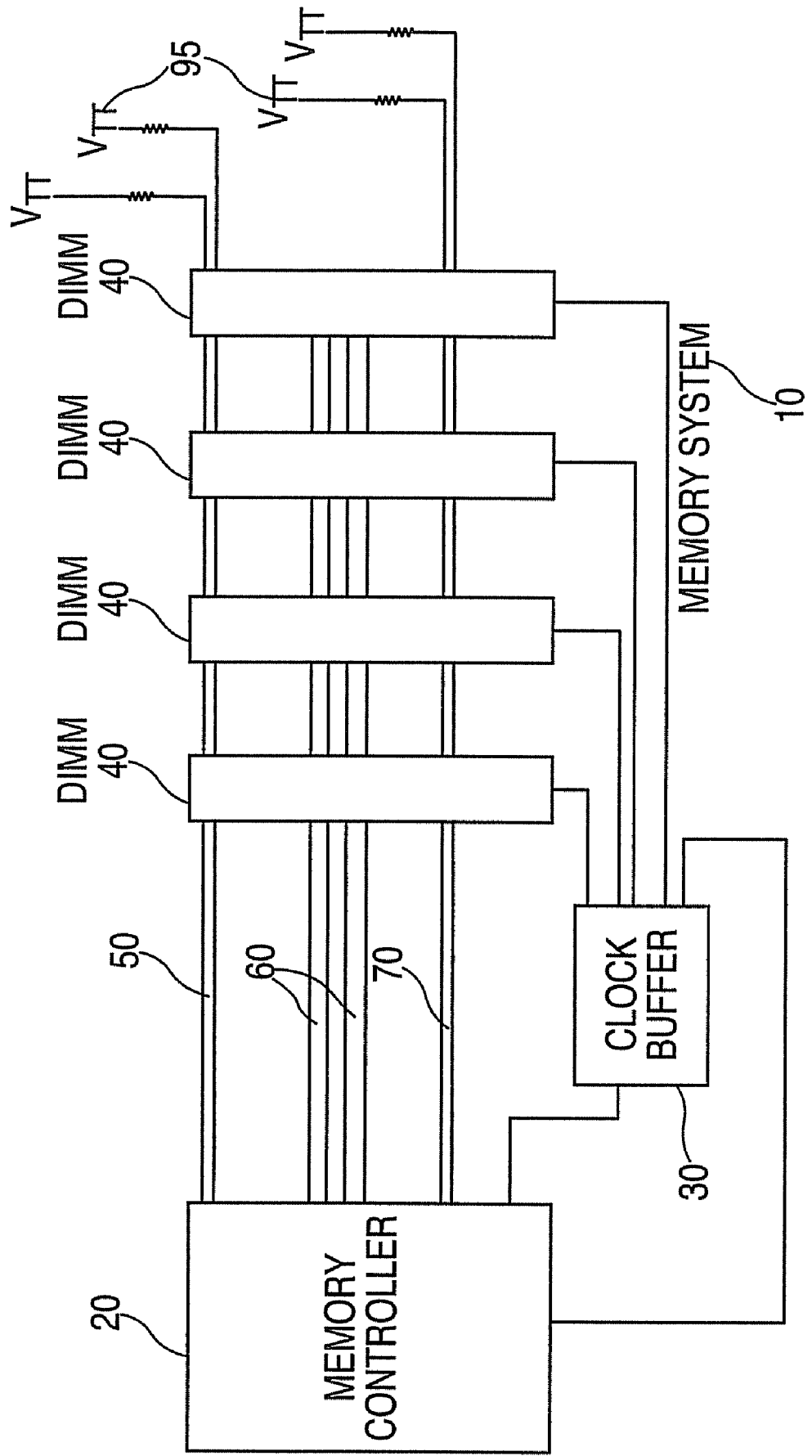
FIG. 3 depicts an exemplary memory system, shown with a single, traditional multi-drop stub bus.
Figure 4:
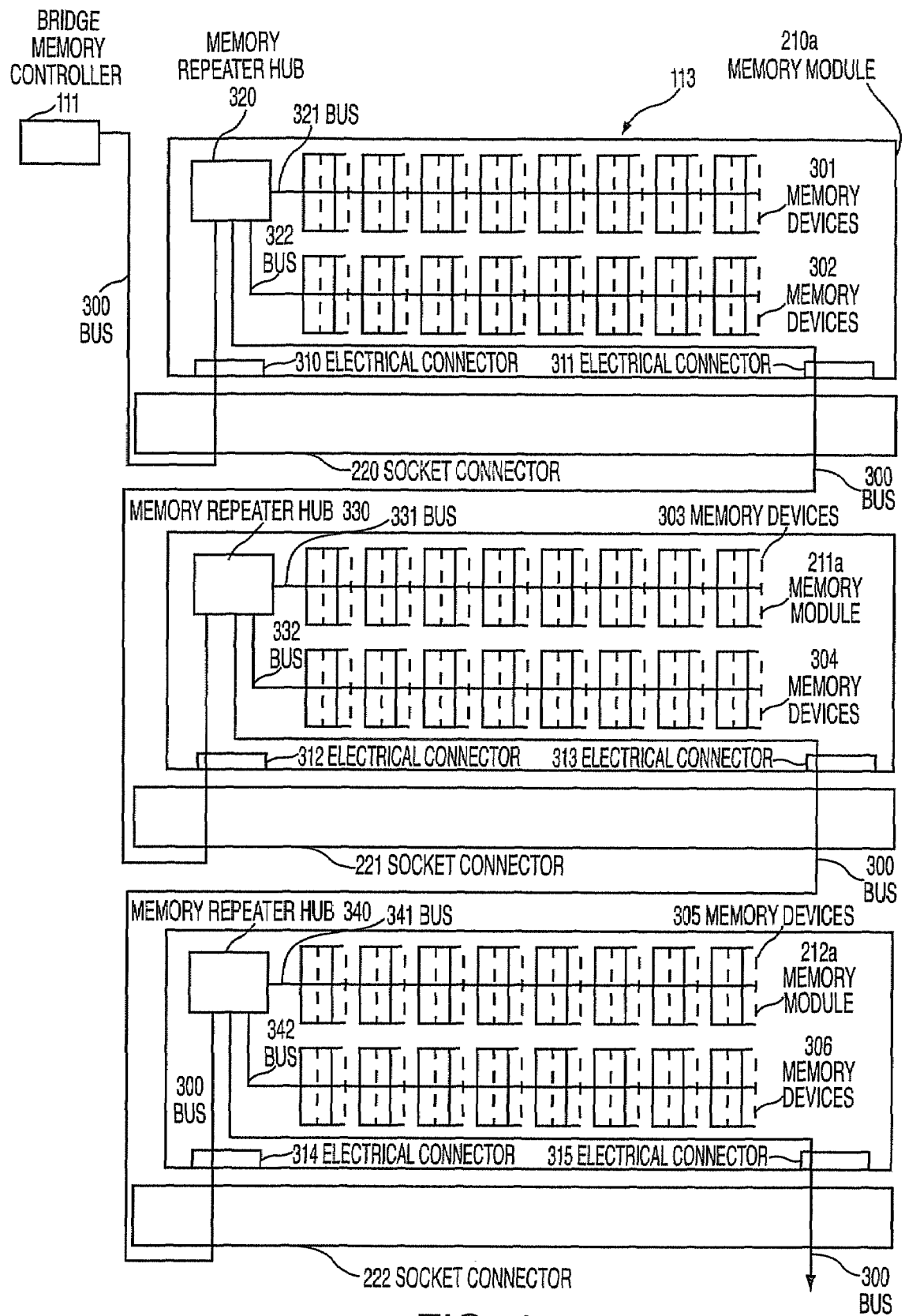
FIG. 4 depicts a fully buffered synchronous memory module and system structure, where the fully buffered synchronous memory module includes a repeater function.
Figure 5:
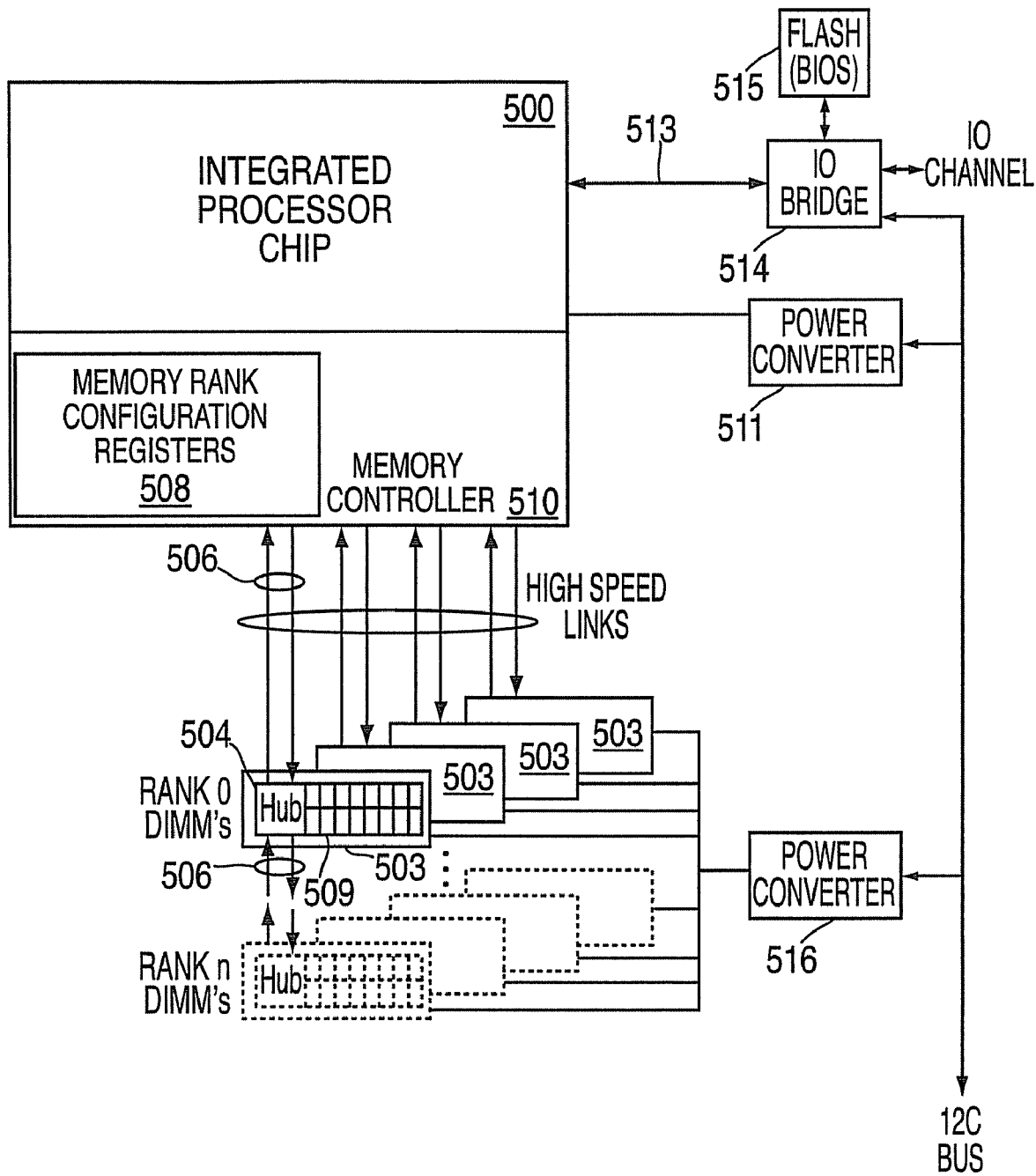
FIG. 5 depicts a block diagram of a computer memory system which includes multiple independent cascade interconnect memory interface busses that operate in unison to support a single data access request.
Figure 6:
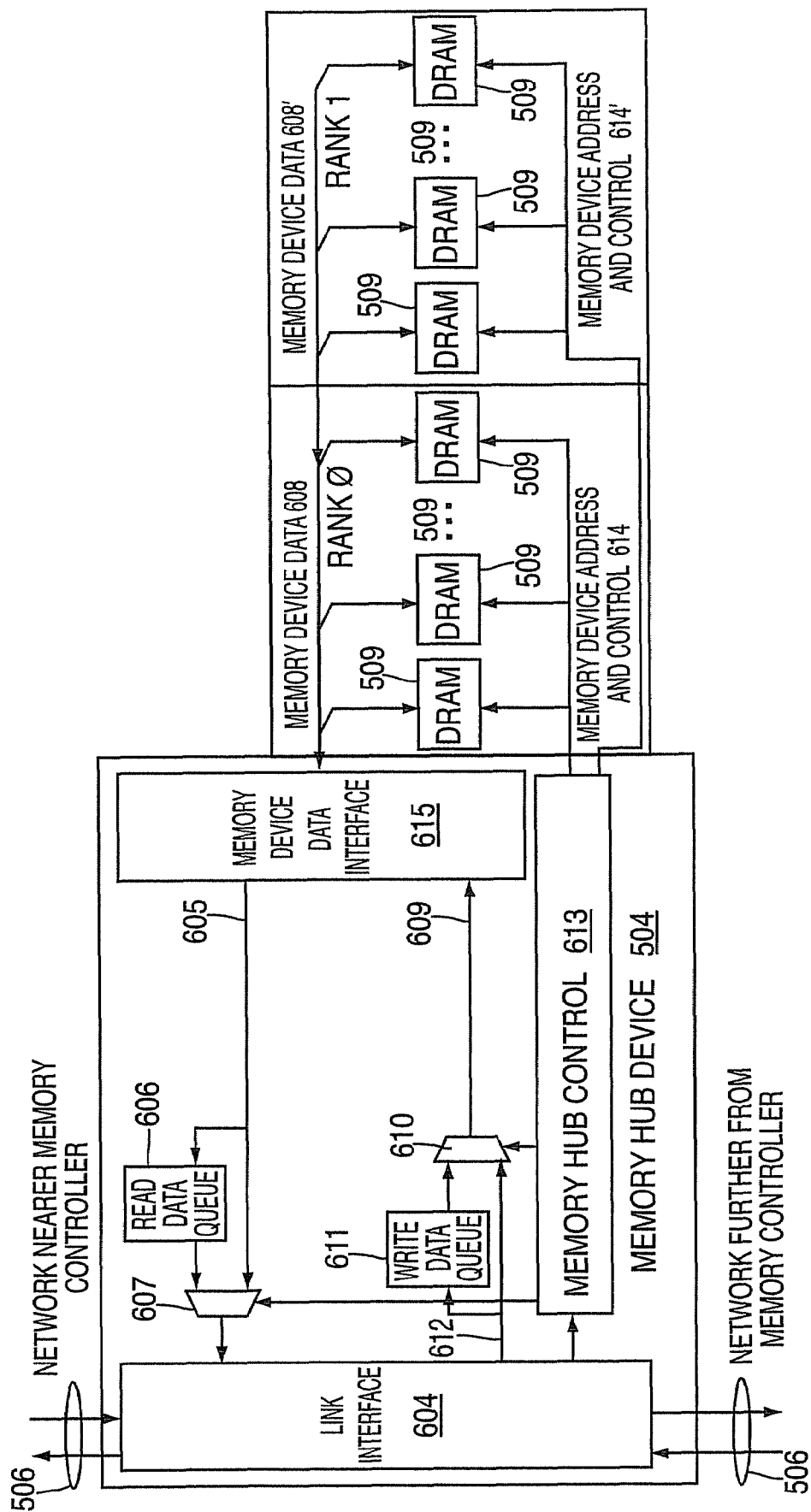
FIG. 6 is a block diagram of an exemplary hub device in a memory subsystem.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. The DIMM depicted in FIG. 1 includes 168 pins in the exemplary embodiment, whereas subsequent DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. In exemplary embodiments, the downstream memory bus connects a memory controller to a hub device, or connects a hub device to another hub device further away from the memory controller. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options. In exemplary embodiments, the downstream bus has a protocol that is used to control the memory system.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options. In exemplary embodiments, the upstream bus has a protocol that is used to receive responses from the memory system.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in some of the Figures, the system, memory modules or hub devices may also include a separate bus, such as a 'presence detect' bus, an I2C bus, service processor bus and/or an SMBus which is used for one or more purposes including such memory system-related functions as the determination of the hub device an/or memory module attributes (generally after power-up), the reporting of fault or status information to the system, the reporting of device and/or local temperatures within the computer system, the reporting of air flows within the system, the modification of air flow baffle settings, the reporting of system installation altitude, modification of local voltage settings, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller(s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it at another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electiic RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

The one or more memory modules (or memory subsystems) and/or hub devices may be connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency(ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor)

which may be used for this and other purposes, etc. In one embodiment, the high speed bus may be used to complete the initialization of the memory subsystem(s), generally by first completing a training process to establish reliable communication, then by interrogation of the attribute or 'presence detect' data associated the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency(ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits of exemplary embodiments include the ability to determine the actual power utilization for specific memory hardware at actual utilizations and environmental conditions. This information may be utilized by the memory controller to proactively manage the power utilization in a memory system.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A memory system comprising:
   a physical memory comprised of a plurality of memory devices; and
   a memory controller in communication with the physical memory and having a logical memory for storing power usage characteristics associated with the physical memory, the power usage characteristics generated in response to a current operating environment of the memory system and correlated to reference patterns that include memory access sequences, wherein power usage characteristic generation includes applying a reference pattern to the physical memory, sampling a power measurement in response to applying the reference pattern, and calculating a power usage characteristic in response to the power measurement.

2. The memory system of claim 1 wherein the memory controller regulates a memory access request service rate based on a threshold value.

3. The memory system of claim 2 wherein the threshold value is a maximum power utilization.

4. The memory system of claim 2 wherein the threshold value is a maximum temperature.

5. The memory system of claim 1 wherein the power usage characteristics further correlate to physical memory utilization rates.

6. The memory system of claim 1 wherein the physical memory is organized into ranks of memory devices with each rank comprising the minimum number of memory devices activated to service a memory access.

7. The memory system of claim 1 wherein the physical memory is in communication with the memory controller via a bus.

8. The memory system of claim 1 wherein the logical memory for storing power usage characteristics is organized by configured ranks of memory devices in said physical memory.

9. The memory system of claim 1 wherein the power usage characteristics are encoded for efficiency.

10. The memory system of claim 1 wherein the power usage characteristics are utilized by the memory controller to perform power management in the memory system.

11. The memory system of claim 1 wherein the power usage characteristics are updated during memory system operation based on new supplied power measurements.

12. The memory system of claim 1 further comprising a power management software program for facilitating creation of the power usage characteristics.

13. The memory system of claim 1 wherein the power usage characteristics are generated by a power management software program located in a basic input output system (BIOS) executed when the memory system is initialized.

14. The memory system of claim 1 wherein the power usage characteristics include one or more of thermal loading effects and power consumption effects.

15. A memory system for storing and retrieving data for a processing system, the memory system comprising:
   a plurality of memory devices;
   a memory controller for receiving and responding to memory access requests and having a logical memory for storing power usage characteristics associated with one or more of the memory devices, the power usage characteristics generated in response to a current operating environment of the memory system and correlated to reference patterns that include memory access sequences, wherein power usage characteristic generation includes applying a reference pattern to one or more of the one or more of the memory devices, sampling a power measurement in response to applying the reference pattern, and calculating a power usage characteristic in response to the power measurement;
   a memory bus in communication with the memory controller; and
   a memory hub device in communication with the memory bus and with the memory devices.

16. The memory system of claim 15 wherein the power usage characteristics further correlate to physical memory utilization rates.

17. The memory system of claim 15 wherein the memory devices are organized into ranks with each rank comprising the minimum number of memory devices activated to service a memory access.

18. The memory system of claim 17 wherein the logical memory for storing power usage characteristics is organized based on the ranks.

19. The memory system of claim 15 wherein the power usage characteristics are generated by a power management software program located in a basic input output system (BIOS) executed by the memory controller when the memory system is initialized.

20. A method for measuring power utilization in a memory system, the method comprising:
   initializing a physical memory to a minimum power operational state;
   measuring supplied power to the physical memory to establish nominal power consumption;
   generating memory access requests at a specific level of utilization targeting selected segments in the physical memory and simultaneously measuring the supplied power to the physical memory to establish power consumption for the memory access requests at the selected segments in the physical memory;
   computing the additional power consumption created by the memory access requests by subtracting the nominal power consumption from the power consumption for the memory access request; and
   storing the calculated additional power consumption as a power usage characteristic associated with the specific level of utilization and the selected segments.

21. The method of claim 20 wherein the measuring the supplied power is comprised of multiple measurements mathematically combined for improved accuracy.

22. The method of claim 20 wherein the selected segments comprise a rank of physical memory.

23. The method of claim 20 further comprising applying the generating, computing and storing to all memory segments in the physical memory.

24. The method of claim 20 further comprising pre-conditioning the physical memory with activity before performing the generating.

25. The method of claim 24 wherein the pre-conditioning results in the selected segments being pre-heated to an operating temperature.

26. The method of claim 20 wherein the power usage characteristics are utilized by a memory controller to perform power management in the memory system.

27. The method of claim 20 wherein the power usage characteristics are updated during memory system operation based on new supplied power measurements.

28. The method of claim 20 further comprising determining a thermal loading effect for the additional power consumption, calculating a conversion factor and logging the conversion factor.

* * * * *